US012604399B2

(12) United States Patent
Hidani et al.

(10) Patent No.: US 12,604,399 B2
(45) Date of Patent: Apr. 14, 2026

(54) SUBSTRATE FOR PRINTED WIRING BOARD AND PRINTED WIRING BOARD

(71) Applicant: SUMITOMO ELECTRIC INDUSTRIES, LTD., Osaka (JP)

(72) Inventors: Takuto Hidani, Osaka (JP); Katsunari Mikage, Osaka (JP); Kenta Imakita, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 224 days.

(21) Appl. No.: 18/695,592

(22) PCT Filed: Mar. 17, 2023

(86) PCT No.: PCT/JP2023/010643
§ 371 (c)(1),
(2) Date: Mar. 26, 2024

(87) PCT Pub. No.: WO2023/189744
PCT Pub. Date: Oct. 5, 2023

(65) Prior Publication Data
US 2025/0024598 A1 Jan. 16, 2025

(30) Foreign Application Priority Data
Mar. 29, 2022 (JP) ................................. 2022-053407

(51) Int. Cl.
*H05K 1/00* (2006.01)
*H05K 1/09* (2006.01)
(Continued)

(52) U.S. Cl.
CPC ............... *H05K 1/09* (2013.01); *H05K 1/115* (2013.01); *H05K 3/422* (2013.01)

100

(58) Field of Classification Search
CPC ........... H05K 1/09; H05K 1/115; H05K 3/422
See application file for complete search history.

(56) References Cited

U.S. PATENT DOCUMENTS

2006/0243478 A1* 11/2006 Inagaki ................... H01L 23/50
257/E23.079
2007/0096328 A1* 5/2007 Takahashi ............... H01L 23/48
257/774
(Continued)

FOREIGN PATENT DOCUMENTS

JP 1988-054071 B 10/1988
JP H03-201592 A 9/1991
(Continued)

*Primary Examiner* — Pete T Lee
(74) *Attorney, Agent, or Firm* — Renner, Otto, Boisselle & Sklar, LLP

(57) ABSTRACT

A substrate for a printed wiring board comprises: a base film having a first main surface and a second main surface; a first conductive layer disposed on the first main surface; a second conductive layer disposed on the second main surface; a first electroless copper plating layer disposed on the first conductive layer; a second electroless copper plating layer disposed on the second conductive layer; and a third electroless copper plating layer. In the base film, a through hole extending through the base film along a thickness direction of the base film is formed. The third electroless copper plating layer is disposed on an inner wall surface of the through hole. An amount of palladium in the base film at each of the first main surface and the second main surface is smaller than an amount of palladium in the base film at the inner wall surface.

9 Claims, 18 Drawing Sheets

(51) Int. Cl.
H05K 1/11 (2006.01)
H05K 3/42 (2006.01)

(56)      References Cited

U.S. PATENT DOCUMENTS

| | | | |
|---|---|---|---|
| 2012/0073870 A1* | 3/2012 | Jeon .................. | H01L 23/49827 |
| | | | 174/262 |
| 2021/0014978 A1 | 1/2021 | Hashizume et al. | |
| 2023/0371176 A1 | 11/2023 | Hidani et al. | |

FOREIGN PATENT DOCUMENTS

| | | | |
|---|---|---|---|
| JP | 2000-307245 A | 11/2000 | |
| JP | 2003-158364 A | 5/2003 | |
| JP | 2016-58545 A | 4/2016 | |
| JP | 2017-98422 A | 6/2017 | |
| JP | 2019-197851 A | 11/2019 | |
| WO | 2019/208077 A1 | 10/2019 | |
| WO | 2022/075239 A1 | 4/2022 | |

* cited by examiner

100

SUBSTRATE FOR PRINTED WIRING BOARD AND PRINTED WIRING BOARD

TECHNICAL FIELD

The present disclosure relates to a substrate for a printed wiring board and a printed wiring board. This application claims priority based on Japanese Patent Application No. 2022-053407 filed on Mar. 29, 2022, the entire contents of which are incorporated herein by reference.

BACKGROUND ART

For example, WO 2019/208077 (PTL 1) describes a substrate for a printed wiring board. The substrate for a printed wiring board described in PTL 1 includes a base film, a first sintered material layer, a second sintered material layer, a first electroless copper plating layer, and a second electroless copper plating layer.

The base film has a first main surface and a second main surface. The first sintered material layer and the second sintered material layer are disposed on the first main surface and the second main surface, respectively. The first sintered material layer and the second sintered material layer are formed by sintering a plurality of copper particles. The first electroless copper plating layer and the second electroless copper plating layer are disposed on the first sintered material layer and the second sintered material layer, respectively.

CITATION LIST

Patent Literature

PTL 1: WO 2019/208077

SUMMARY OF INVENTION

A substrate for a printed wiring board according to the present disclosure includes a base film having a first main surface and a second main surface, a first conductive layer disposed on the first main surface, a second conductive layer disposed on the second main surface, a first electroless copper plating layer disposed on the first conductive layer, a second electroless copper plating layer disposed on the second conductive layer, and a third electroless copper plating layer. In the base film, a through hole extending through the base film along a thickness direction of the base film is formed. The third electroless copper plating layer is disposed on an inner wall surface of the through hole. An amount of palladium in the base film at each of the first main surface and the second main surface is smaller than an amount of palladium in the base film at the inner wall surface.

DETAILED DESCRIPTION

Figure 1:
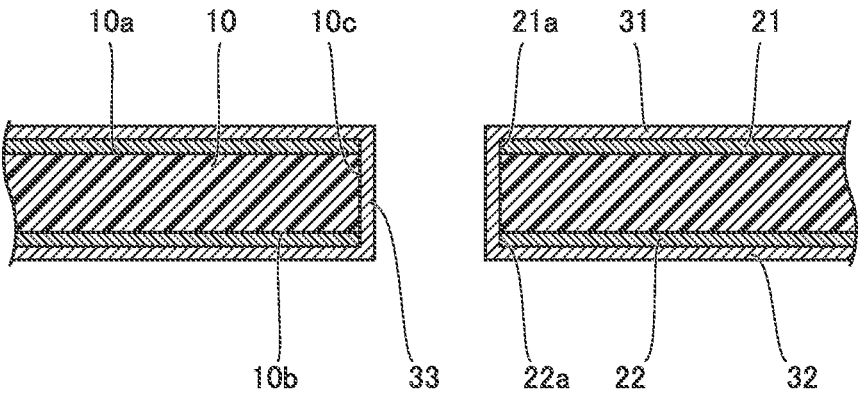
FIG. 1 is a cross-sectional view of a substrate 100 for a printed wiring board.

Problems to be Solved by Present Disclosure

When a printed wiring board having a first wiring line on a first main surface and a second wiring line on a second main surface is formed using the substrate for a printed wiring board described in PTL 1, the first wiring line and the second wiring line cannot be formed at a fine pitch while ensuring the reliability in conduction between the first wiring line and the second wiring line.

The present disclosure has been made in view of the problem of the conventional art described above. More specifically, the present disclosure provides a substrate for a printed wiring board with which wiring lines can be formed at a fine pitch while ensuring reliability in conduction between a wiring line formed on one main surface and a wiring line formed on the other main surface.

Advantageous Effect of the Present Disclosure

According to the substrate for a printed wiring board of the present disclosure, wiring lines can be formed at a fine pitch while ensuring the reliability in conduction between a wiring line formed on one main surface and a wiring line formed on the other main surface.

Description of Embodiments

First, embodiments of the present disclosure will be listed and described.

(1) A substrate for a printed wiring board according to an embodiment includes a base film having a first main surface and a second main surface, a first conductive layer disposed on the first main surface, a second conductive layer disposed on the second main surface, a first electroless copper plating layer disposed on the first conductive layer, a second electroless copper plating layer disposed on the second conductive layer, and a third electroless copper plating layer. In the base film, a through hole extending through the base film along a thickness direction of the base film is formed. The third electroless copper plating layer is disposed on an inner wall surface of the through hole. An amount of palladium in the base film at each of the first main surface and the second main surface is smaller than an amount of palladium in the base film at the inner wall surface. According to the substrate for a printed wiring board of the above (1), wiring lines can be formed at a fine pitch while ensuring the reliability in conduction between a wiring line formed on the first main surface and a wiring line formed on the second main surface.

(2) In the substrate for a printed wiring board according to the above (1), the amount of palladium in the base film at each of the first main surface and the second main surface may be 0.02 atomic percent or less. The amount of palladium in the base film at the inner wall surface may be 0.06 atomic percent or more. According to the substrate for a printed wiring board of the above (2), the wiring lines can be formed at a finer pitch while further ensuring the reliability in conduction between the wiring line formed on the first main surface and the wiring line formed on the second main surface.

(3) In the substrate for a printed wiring board according to the above (1) or (2), the amount of palladium in the base film at each of the first main surface and the second main surface may be 0.008 atomic percent or less. The amount of palladium in the base film at the inner wall surface may be 0.07 atomic percent or more. According to the substrate for a printed wiring board of the above (3), the wiring lines can be formed at a finer pitch while further ensuring the reliability in conduction between the wiring line formed on the first main surface and the wiring line formed on the second main surface.

(4) In the substrate for a printed wiring board according to any one of the above (1) to (3), the first conductive layer and the second conductive layer may be layers each including a plurality of sintered copper particles.

(5) In the substrate for a printed wiring board according to the above (4), an amount of palladium in each of the first conductive layer and the second conductive layer may be 0.08 atomic percent or less.

(6) In the substrate for a printed wiring board according to any one of the above (1) to (5), an amount of palladium in each of the first electroless copper plating layer and the second electroless copper plating layer may be 0.07 atomic percent or less.

(7) In the substrate for a printed wiring board according to any one of the above (1) to (6), an amount of nickel in the base film at each of the first main surface and the second main surface may be smaller than an amount of nickel in the base film at the inner wall surface.

(8) A printed wiring board according to an embodiment includes a base film having a first main surface and a second main surface, a first wiring line having a first conductive layer disposed on the first main surface, a first electroless copper plating layer disposed on the first conductive layer, and a first electrolytic copper plating layer disposed on the first electroless copper plating layer, a second wiring line having a second conductive layer disposed on the second main surface, a second electroless copper plating layer disposed on the second conductive layer, and a second electrolytic copper plating layer disposed on the second electroless copper plating layer, a third electroless copper plating layer, and a third electrolytic copper plating layer. In the base film, a through hole extending through the base film along a thickness direction of the base film is formed. The third electroless copper plating layer is disposed on an inner wall surface of the through hole. The third electrolytic copper plating layer is disposed on the third electroless copper plating layer. The first wiring line is electrically connected to the second wiring line by the third electroless copper plating layer and the third electrolytic copper plating layer. An amount of palladium in the base film at each of the first main surface and the second main surface is smaller than an amount of palladium in the base film at the inner wall surface. According to the printed wiring board of the above (8), the first wiring line and the second wiring line can be formed at a fine pitch while ensuring the reliability in conduction between the first wiring line and the second wiring line.

(9) In the printed wiring board according to the above (8), a distance between two portions of the first wiring line adjacent to each other with a space between the two portions of the first wiring line and a distance between two portions of the second wiring line adjacent to each other with a space between the two portions of the second wiring line may be each 20 μm or less.

Detailed Description of Embodiments

The details of embodiments of the present disclosure will be described with reference to the drawings. In the following drawings, the same or corresponding portions are designated by the same reference symbols and the same description thereof will not be repeated. A substrate for a printed wiring board and a printed wiring board according to the embodiment are referred to as a substrate 100 for a printed wiring board and a printed wiring board 200, respectively.

(Configuration of Substrate 100 for Printed Wiring Board)

A configuration of substrate 100 for a printed wiring board will be described below.

FIG. 1 is a cross-sectional view of substrate 100 for a printed wiring board. As shown in FIG. 1, substrate 100 for a printed wiring board includes a base film 10, a first conductive layer 21, a second conductive layer 22, a first electroless copper plating layer 31, a second electroless copper plating layer 32, and a third electroless copper plating layer 33.

Base film 10 has a first main surface 10a and a second main surface 10b. First main surface 10a and second main surface 10b are end surfaces of base film 10 in a thickness direction thereof. Second main surface 10b is a surface opposite to first main surface 10a. A through hole 10c is formed in base film 10. Through hole 10c extends through base film 10 along the thickness direction. Base film 10 is formed of a flexible insulating material. Base film 10 is formed of, for example, polyimide, liquid crystal polymer, fluororesin, or the like. However, the material forming base film 10 is not limited to the material described above.

An amount of palladium in base film 10 at each of first main surface 10a and second main surface 10b is smaller than an amount of palladium in base film 10 at an inner wall surface of through hole 10c. An amount of nickel in base film 10 at each of first main surface 10a and second main surface 10b may be smaller than an amount of nickel in base film 10 at the inner wall surface of through hole 10c.

The amount of palladium in base film 10 at each of first main surface 10a and second main surface 10b may be 0.02 atomic percent or less. The amount of palladium in base film 10 at each of first main surface 10a and second main surface 10b may be 0.008 atomic percent or less. The amount of palladium in base film 10 at the inner wall surface of through hole 10c may be 0.06 atomic percent or more. The amount of palladium in base film 10 at the inner wall surface of through hole 10c may be 0.07 atomic percent or more.

The amount of palladium in base film 10 is measured with an energy dispersive X-ray analyzer (for example, SU8020 manufactured by Hitachi High-Technologies Corporation). An acceleration voltage for the measurement is set to 6 kV. A position for measuring the amount of palladium in base film 10 at first main surface 10*a* is set to any region of base film 10 within a distance of 100 nm from an interface between first main surface 10*a* and first conductive layer 21. A position for measuring the amount of palladium in base film 10 at second main surface 10*b* is set to any region of base film 10 within a distance of 100 nm from an interface between second main surface 10*b* and second conductive layer 22. A position for measuring the amount of palladium in base film 10 at the inner wall surface of through hole 10*c* is set to any region of base film 10 within a distance of 100 nm from an interface between base film 10 at the inner wall surface of through hole 10*c* and third electroless copper plating layer 33. The amount of nickel in base film 10 is measured by the same method as the method for the amount of palladium in base film 10.

First conductive layer 21 is disposed on first main surface 10*a*. First conductive layer 21 is formed of a plurality of sintered copper particles. Therefore, first conductive layer 21 is porous. An average particle size of the copper particles included in first conductive layer 21 may be 1 nm or more, or 30 nm or more. The average particle size of the copper particles included in first conductive layer 21 may be 100 nm or less, or 500 nm or less. That is, the copper particles included in first conductive layer 21 may be copper nanoparticles. The average particle size of the copper particles included in first conductive layer 21 is measured by a particle size distribution measuring apparatus (for example, a microtrac particle size distribution analyzer UPA-150EX manufactured by Nikkiso Co., Ltd.).

Second conductive layer 22 is disposed on second main surface 10*b*. Second conductive layer 22 is formed of a plurality of sintered copper particles. Therefore, second conductive layer 22 is porous. An average particle size of the copper particles included in second conductive layer 22 may be 1 nm or more, or 30 nm or more. The average particle size of the copper particles included in second conductive layer 22 may be 100 nm or less, or 500 nm or less. That is, the copper particles included in second conductive layer 22 may be copper nanoparticles. The average particle size of the copper particles included in second conductive layer 22 is measured by the same method as the method for the average particle size of the copper particles included in first conductive layer 21.

An amount of palladium in each of first conductive layer 21 and second conductive layer 22 may be 0.08 atomic percent or less. The amount of palladium in each of first conductive layer 21 and second conductive layer 22 may be zero atomic percent. From another viewpoint, each of first conductive layer 21 and second conductive layer 22 may not contain palladium. The amount of palladium in first conductive layer 21 is a palladium content at any region including entirety from an interface between base film 10 and first conductive layer 21 to an interface between first conductive layer 21 and first electroless copper plating layer 31 in the thickness direction thereof. The amount of palladium in second conductive layer 22 is a palladium content at any region including entirety from an interface between base film 10 and second conductive layer 22 to an interface between second conductive layer 22 and second electroless copper plating layer 32 in the thickness direction thereof. The amount of palladium in each of first conductive layer 21 and the amount of palladium in second conductive layer 22 are measured by the same method as the method for the amount of palladium in base film 10 except for the measurement region.

In first conductive layer 21, a through hole 21*a* extending through first conductive layer 21 along the thickness direction thereof is formed. In second conductive layer 22, a through hole 22*a* extending through second conductive layer 22 in the thickness direction thereof is formed. Through hole 21*a* and through hole 22*a* overlap through hole 10*c* in a plan view. An inner wall surface of through hole 21*a* and an inner wall surface of through hole 22*a* are contiguous to the inner wall surface of through hole 10*c*.

In the above example, the materials forming first conductive layer 21 and second conductive layer 22 are sintered materials of copper particles. However, first conductive layer 21 and second conductive layer 22 are not limited to layers formed of the sintered materials.

First electroless copper plating layer 31 is disposed on first conductive layer 21. First electroless copper plating layer 31 is a copper layer formed by electroless plating. An amount of palladium in first electroless copper plating layer 31 may be 0.07 atomic percent or less. Second electroless copper plating layer 32 is disposed on second conductive layer 22. Second electroless copper plating layer 32 is a copper layer formed by electroless plating. An amount of palladium in second electroless copper plating layer 32 may be 0.07 atomic percent or less. The amount of palladium in first electroless copper plating layer 31 is a palladium content at any region including entirety from an interface between first conductive layer 21 and first electroless copper plating layer 31 to a surface of first electroless copper plating layer 31 opposite to the interface in the thickness direction thereof. The amount of palladium in second electroless copper plating layer 32 is a palladium content at any region including entirety from an interface between second conductive layer 22 and second electroless copper plating layer 32 to a surface of second electroless copper plating layer 32 opposite to the interface in the thickness direction thereof. The amount of palladium in each of first electroless copper plating layer 31 and the amount of palladium in second electroless copper plating layer 32 are measured by the same method as the method for the amount of palladium in base film 10 except for the measurement region.

Third electroless copper plating layer 33 is disposed on the inner wall surface of through hole 10*c*. Third electroless copper plating layer 33 is also disposed on the inner wall surface of through hole 21*a* and the inner wall surface of through hole 22*a*. Third electroless copper plating layer 33 is a copper layer formed by electroless plating. First electroless copper plating layer 31, second electroless copper plating layer 32, and third electroless copper plating layer 33 may contain nickel.

(Method of Manufacturing Substrate 100 for Printed Wiring Board)

Hereinafter, a method of manufacturing substrate 100 for a printed wiring board will be described.

Figure 2:
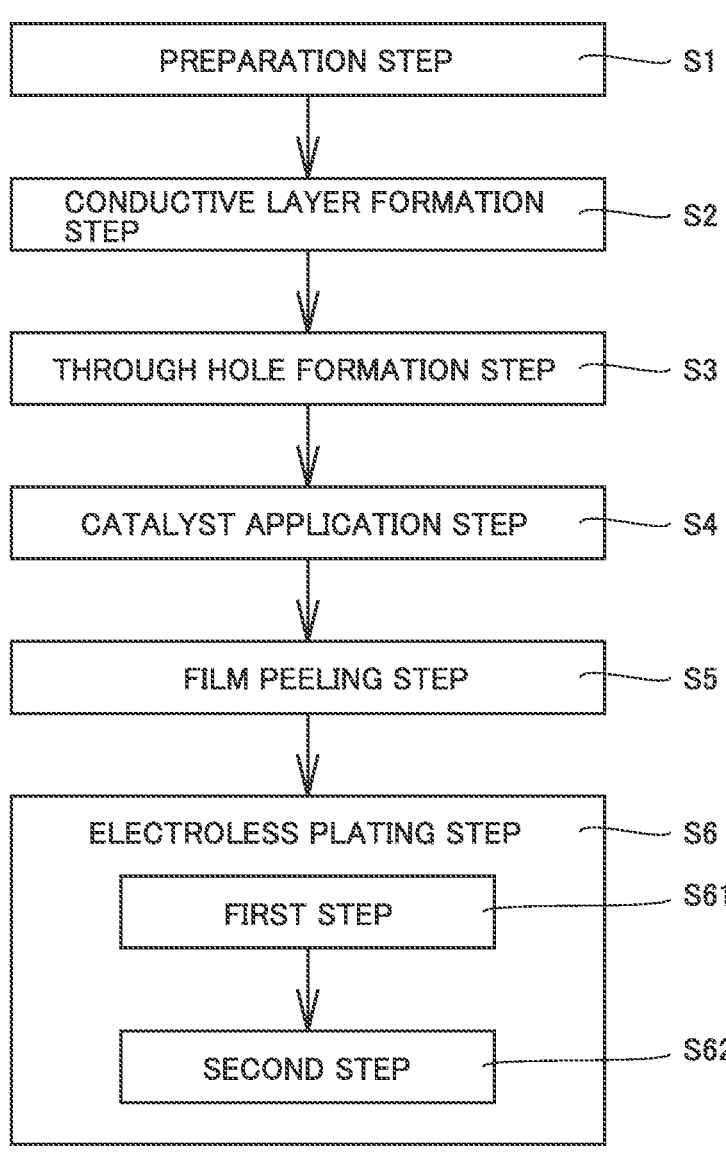
FIG. 2 is a flowchart of manufacturing substrate 100 for a printed wiring board.

FIG. 2 is a flowchart of manufacturing substrate 100 for a printed wiring board. As shown in FIG. 2, the method of manufacturing substrate 100 for a printed wiring board includes a preparation step S1, a conductive layer formation step S2, a through hole formation step S3, a catalyst application step S4, a film peeling step S5, and an electroless plating step S6.

Conductive layer formation step S2 is performed after preparation step S1. Through hole formation step S3 is performed after conductive layer formation step S2. Catalyst application step S4 is performed after through hole formation step S3. Film peeling step S5 is performed after catalyst application step S4. Electroless plating step S6 is performed after film peeling step S5.

Figure 3:
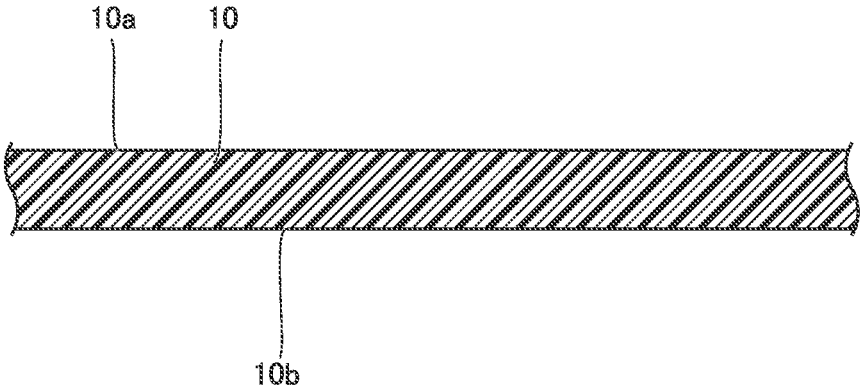
FIG. 3 is a cross-sectional view for illustrating a preparation step S1.

FIG. 3 is a cross-sectional view for illustrating preparation step S1. In preparation step S1, as shown in FIG. 3, base film 10 is prepared. In base film 10 prepared in preparation step S1, first conductive layer 21 and first electroless copper plating layer 31 are not disposed on first main surface 10a, and second conductive layer 22 and second electroless copper plating layer 32 are not disposed on second main surface 10b. In addition, through hole 10c is not formed in base film 10 prepared in preparation step S1.

Figure 4:
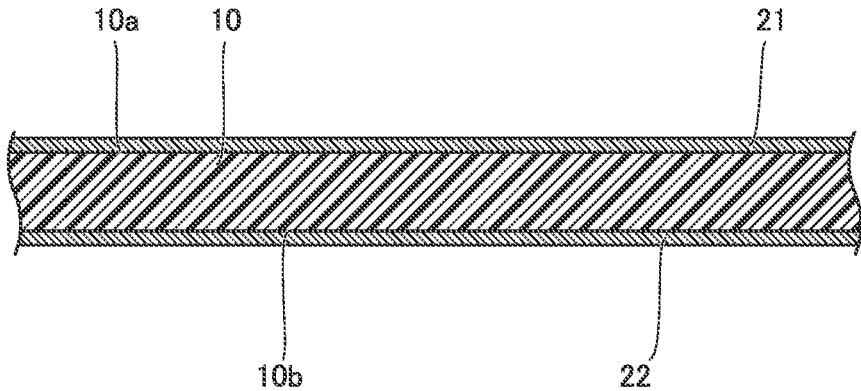
FIG. 4 is a cross-sectional view for illustrating a conductive layer formation step S2.

FIG. 4 is a cross-sectional view for illustrating conductive layer formation step S2. In conductive layer formation step S2, as shown in FIG. 4, first conductive layer 21 and second conductive layer 22 are formed on first main surface 10a and second main surface 10b, respectively. In conductive layer formation step S2, first, a paste including copper particles is applied onto first main surface 10a and second main surface 10b. Second, a solvent contained in the applied paste is dried. Third, the dried paste is fired. As a result, the copper particles included in the dried paste are sintered to one another, and first conductive layer 21 and second conductive layer 22 are formed.

Although not shown in the figure, after conductive layer formation step S2 is performed, a degreasing treatment and an acid cleaning treatment are performed on a surface of first conductive layer 21 (a surface of first conductive layer 21 opposite to first main surface 10a) and a surface of second conductive layer 22 (a surface of second conductive layer 22 opposite to second main surface 10b).

Figure 5:
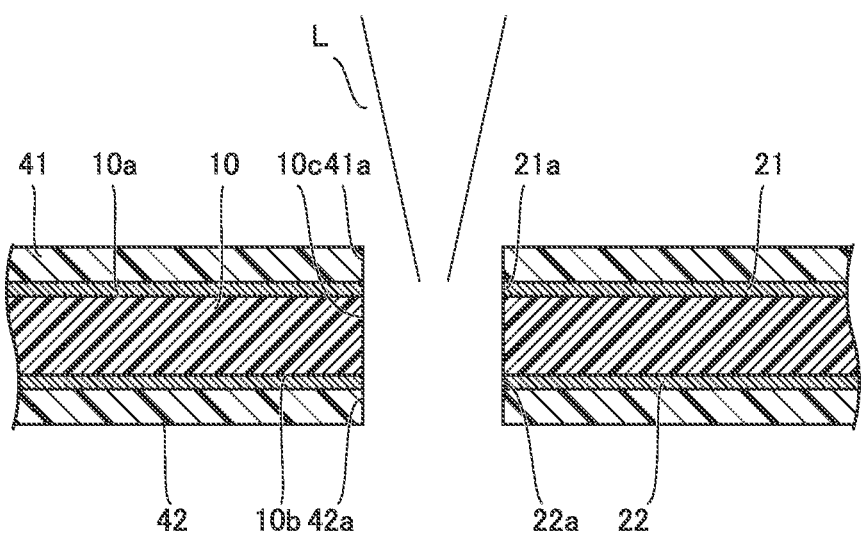
FIG. 5 is a cross-sectional view for illustrating a through hole formation step S3.

FIG. 5 is a cross-sectional view for illustrating through hole formation step S3. In through hole formation step S3, as shown in FIG. 5, through hole 10c is formed in base film 10. In through hole formation step S3, first, a masking film 41 and a masking film 42 are disposed on first conductive layer 21 and second conductive layer 22, respectively.

Second, base film 10, first conductive layer 21, second conductive layer 22, masking film 41, and masking film 42 are irradiated with a laser L. As a result, through hole 10c is formed in base film 10. In addition, through hole 21a is formed in first conductive layer 21, and through hole 22a is formed in second conductive layer 22. Furthermore, a through hole 41a and a through hole 42a are formed in masking film 41 and masking film 42, respectively.

Figure 6:
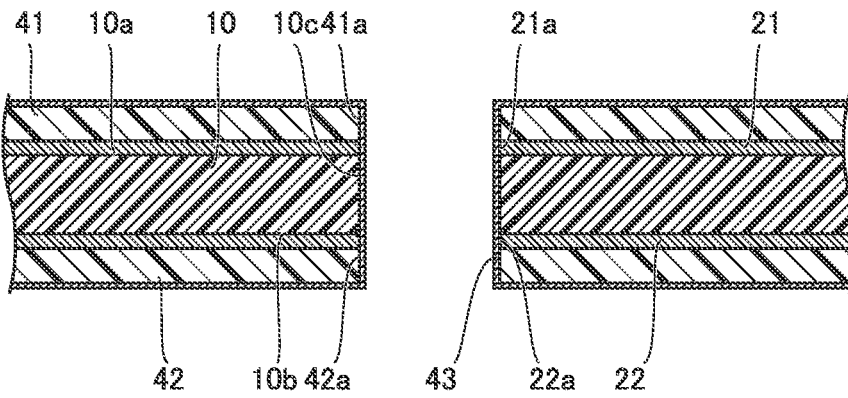
FIG. 6 is a cross-sectional view for illustrating a catalyst application step S4.

FIG. 6 is a cross-sectional view for illustrating catalyst application step S4. As shown in FIG. 6, in catalyst application step S4, a palladium catalyst 43 is applied onto the inner wall surface of through hole 10c, the inner wall surface of through hole 21a, the inner wall surface of through hole 22a, an inner wall surface of through hole 41a, and an inner wall surface of through hole 42a. Palladium catalyst 43 is also applied onto masking film 41 and masking film 42.

Figure 7:
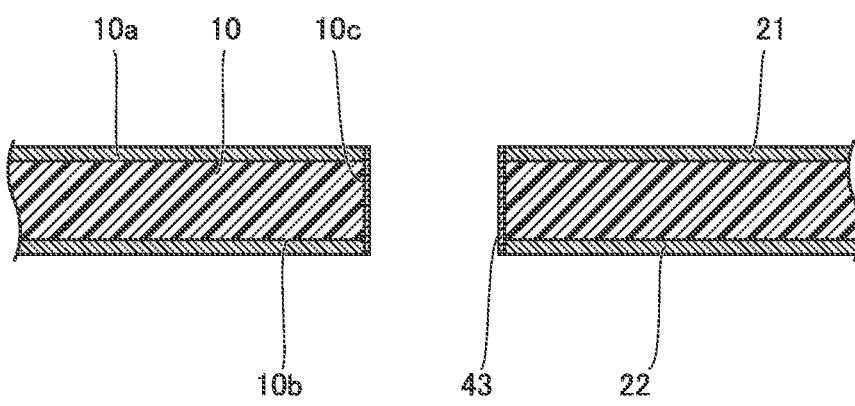
FIG. 7 is a cross-sectional view for illustrating a film peeling step S5.

FIG. 7 is a cross-sectional view for illustrating film peeling step S5. As shown in FIG. 7, in film peeling step S5, masking film 41 is peeled off from first conductive layer 21, and masking film 42 is peeled off from second conductive layer 22.

Figure 8:
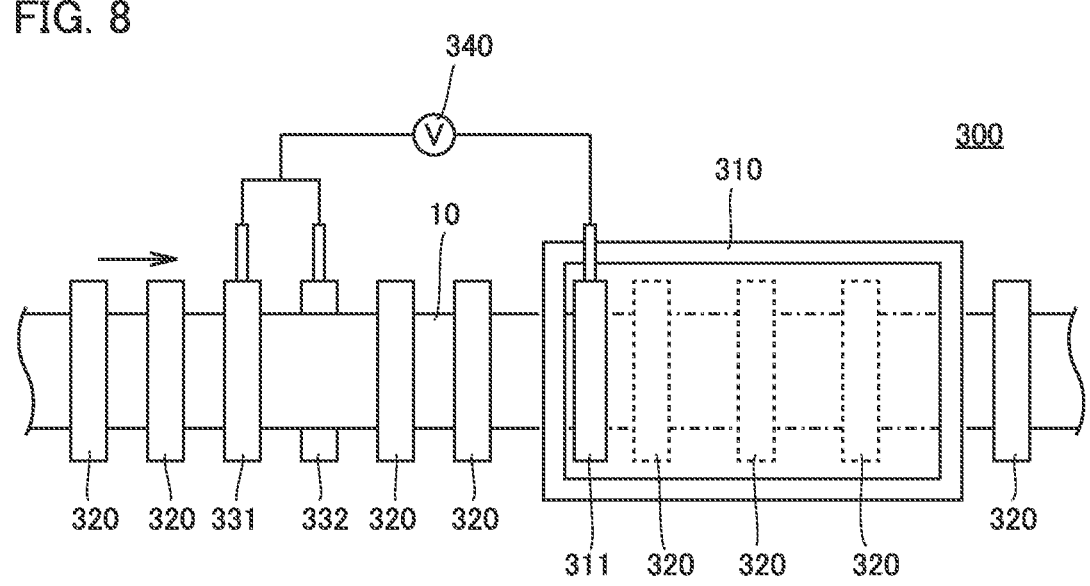
FIG. 8 is a schematic configuration diagram of a plating apparatus 300 used in an electroless plating step S6.

Electroless plating step S6 is performed using a plating apparatus 300. FIG. 8 is a schematic configuration diagram of plating apparatus 300 used in electroless plating step S6. As shown in FIG. 8, plating apparatus 300 includes a plating treatment tank 310, a plurality of rollers 320, an electrode roller 331, an electrode roller 332, and a power supply 340.

A plating solution is stored in plating treatment tank 310. The plating solution contains copper. The plating solution may contain nickel. An electrode 311 is disposed inside plating treatment tank 310. Electrode 311 is formed of a conductive material. Electrode 311 is formed of, for example, titanium. Electrode 311 is immersed in the plating solution.

The plurality of rollers 320 are arranged side by side in a conveyance direction of base film 10 (see the arrow in FIG. 8). Base film 10 is conveyed in the conveyance direction by rotating the plurality of rollers 320. Base film 10 passes through the plating solution stored in plating treatment tank 310 during the conveyance.

Electrode roller 331 and electrode roller 332 are positioned to contact base film 10 before passing through the plating solution. Electrode roller 331 and electrode roller 332 are in contact with first conductive layer 21 and second conductive layer 22, respectively. Electrode roller 331 and electrode roller 332 are formed of, for example, stainless steel.

Power supply 340 is electrically connected to electrode 311, electrode roller 331 and electrode roller 332. More specifically, the positive electrode of power supply 340 is electrically connected to electrode 311, and the negative electrode of power supply 340 is electrically connected to electrode roller 331 and electrode roller 332.

Electroless plating step S6 includes a first step S61 and a second step S62 performed after first step S61. In first step S61, current is applied between electrode 311 and electrode roller 331 and between electrode 311 and electrode roller 332 by power supply 340.

Figure 9:
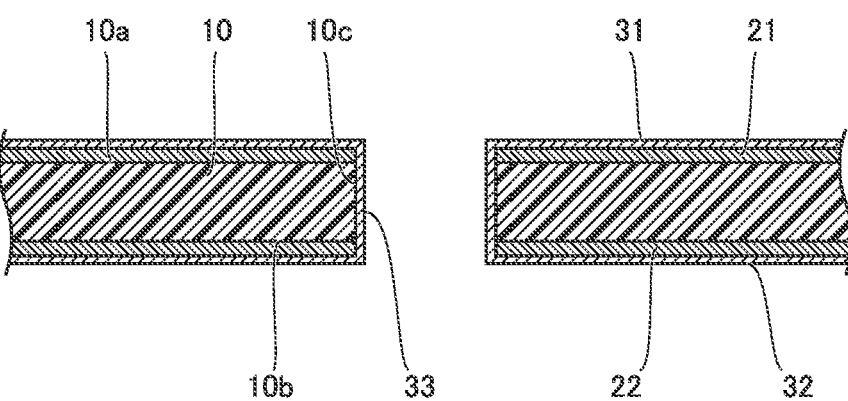
FIG. 9 is a cross-sectional view for illustrating a first step S61.

FIG. 9 is a cross-sectional view for illustrating first step S61. As shown in FIG. 9, first electroless copper plating layer 31 and second electroless copper plating layer 32 are rapidly formed on the surface of first conductive layer 21 and the surface of second conductive layer 22, respectively, by being driven with electrical energy due to the current application.

Figure 10:
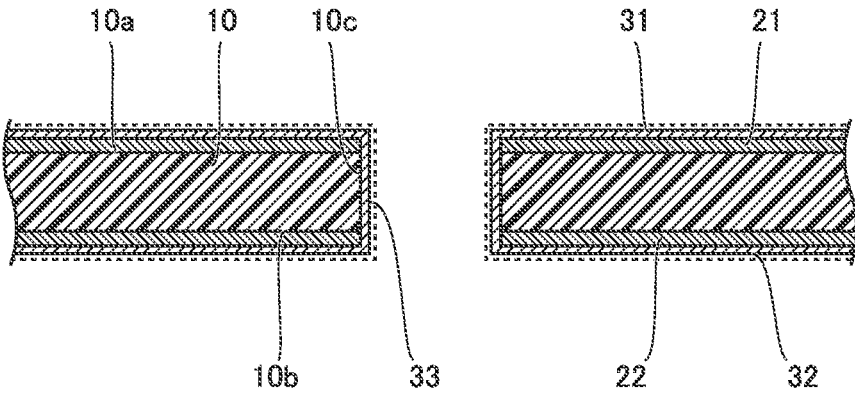
FIG. 10 is a cross-sectional view for illustrating a second step S62.

FIG. 10 is a cross-sectional view for illustrating second step S62. In second step S62, the current application between electrode 311 and electrode roller 331 and between electrode 311 and electrode roller 332 is stopped. However, since first electroless copper plating layer 31 and second electroless copper plating layer 32 are formed in first step S61, as shown in FIG. 10, the growth of first electroless copper plating layer 31 and second electroless copper plating layer 32 continues due to a self-catalytic action of copper without using palladium catalyst 43.

As described above, palladium catalyst 43 is applied onto the inner wall surface of through hole 10c, the inner wall surface of through hole 21a, and the inner wall surface of through hole 22a. Therefore, as shown in FIG. 9 and FIG. 10, in first step S61 and second step S62, third electroless copper plating layer 33 is grown on the inner wall surface of through hole 10c, the inner wall surface of through hole 21a, and the inner wall surface of through hole 22a by being driven with palladium catalyst 43.

Through the above steps, substrate 100 for a printed wiring board having the structure shown in FIG. 1 is manufactured. Although not shown in the figure, annealing may be performed after electroless plating step S6.

(Configuration of Printed Wiring Board 200)

A configuration of printed wiring board 200 will be described below.

Figure 11:
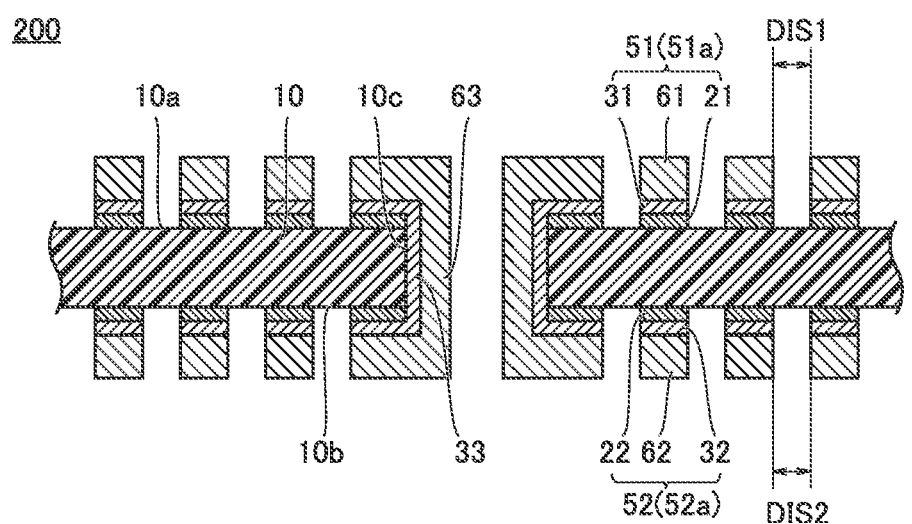
FIG. 11 is a cross-sectional view of a printed wiring board 200.

FIG. 11 is a cross-sectional view of printed wiring board 200. As shown in FIG. 11, printed wiring board 200 includes base film 10, a first wiring line 51, and a second wiring line 52.

A normal direction of first main surface 10a (second main surface 10b) is defined as a first direction DR1. A direction orthogonal to first direction DR1 is defined as a second direction DR2. A direction orthogonal to first direction DR1 and second direction DR2 is defined as a third direction DR3.

First wiring line 51 is disposed on first main surface 10a. First wiring line 51 has first conductive layer 21 disposed on first main surface 10a, first electroless copper plating layer 31 disposed on first conductive layer 21, and a first electrolytic copper plating layer 61 disposed on first electroless copper plating layer 31. First electrolytic copper plating layer 61 is a copper layer formed by electrolytic plating.

Second wiring line 52 is disposed on second main surface 10b. Second wiring line 52 has second conductive layer 22 disposed on second main surface 10b, second electroless copper plating layer 32 disposed on second conductive layer 22, and a second electrolytic copper plating layer 62 disposed on second electroless copper plating layer 32. Second electrolytic copper plating layer 62 is a copper layer formed by electrolytic plating.

Printed wiring board 200 further includes a third electrolytic copper plating layer 63. Third electrolytic copper plating layer 63 is disposed on third electroless copper plating layer 33. First wiring line 51 and second wiring line 52 are electrically connected to each other by third electroless copper plating layer 33 and third electrolytic copper plating layer 63.

First wiring line 51 has a plurality of wiring line portions 51a. Wiring line portions 51a extend in second direction DR2. The plurality of wiring line portions 51a are arranged side by side in third direction DR3. A distance between two adjacent wiring line portions 51a of the plurality of wiring line portions 51a in third direction DR3 is referred to as a distance DIS1. Distance DIS1 may be 20 μm or less. Distance DIS1 may be 10 μm or less.

Second wiring line 52 has a plurality of wiring line portions 52a. Wiring line portions 52a extend in second direction DR2. The plurality of wiring line portions 52a are arranged side by side in third direction DR3. A distance between two adjacent wiring line portions 52a of the plurality of wiring line portions 52a in third direction DR3 is referred to as a distance DIS2. Distance DIS2 may be 20 μm or less. Distance DIS2 may be 10 μm or less.

(Method of Manufacturing Printed Wiring Board 200)

Hereinafter, a method of manufacturing printed wiring board 200 will be described.

Figure 12:
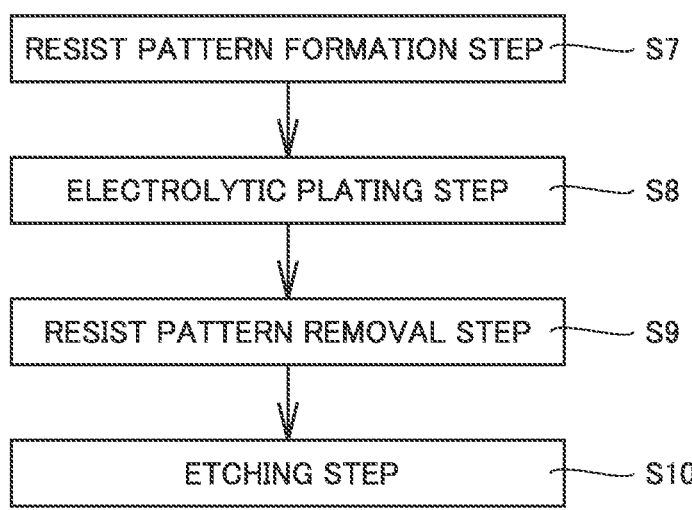
FIG. 12 is a flowchart of manufacturing printed wiring board 200.

FIG. 12 is a flowchart of manufacturing printed wiring board 200. As shown in FIG. 12, the method of manufacturing printed wiring board 200 includes a resist pattern formation step S7, an electrolytic plating step S8, a resist pattern removal step S9, and an etching step S10.

Electrolytic plating step S8 is performed after resist pattern formation step S7. Resist pattern removal step S9 is performed after electrolytic plating step S8. Etching step S10 is performed after resist pattern removal step S9. Printed wiring board 200 is formed using substrate 100 for a printed wiring board.

Figure 13:
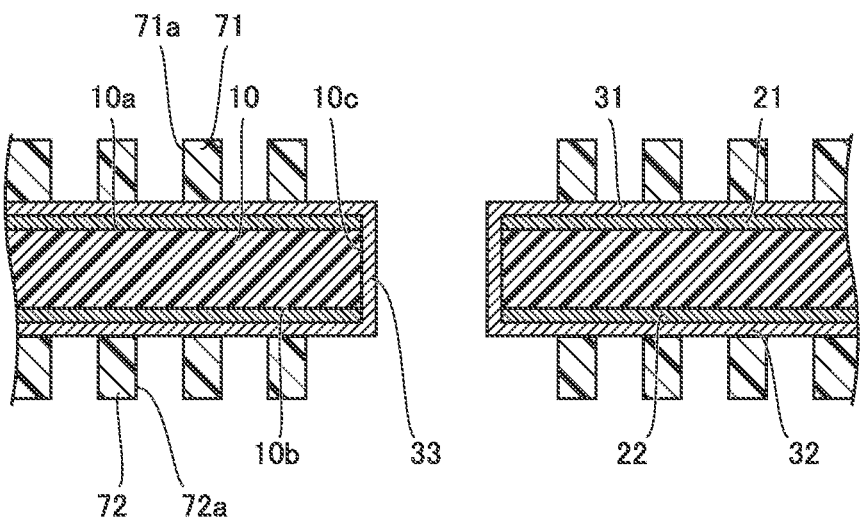
FIG. 13 is a cross-sectional view for illustrating a resist pattern formation step S7.

FIG. 13 is a cross-sectional view for illustrating resist pattern formation step S7. In resist pattern formation step S7, as shown in FIG. 13, a resist pattern 71 and a resist pattern 72 are formed on first electroless copper plating layer 31 and second electroless copper plating layer 32, respectively.

Resist pattern 71 is provided with an opening 71a. Opening 71a extends through resist pattern 71 in a thickness direction. First electroless copper plating layer 31 is exposed at opening 71a. Resist pattern 72 is provided with an opening 72a. Opening 72a extends through resist pattern 72 in the thickness direction. Second electroless copper plating layer 32 is exposed at opening 72a.

First electroless copper plating layer 31 around through hole 10c is exposed at opening 71a, and second electroless copper plating layer 32 around through hole 10c is exposed at opening 72a.

In resist pattern formation step S7, first, a resist is applied onto first electroless copper plating layer 31 and second electroless copper plating layer 32. Second, the applied resist is exposed and developed. As a result, the remaining portion of the resist that is not removed serves as resist pattern 71 and resist pattern 72, and the portion where the resist is removed serves as opening 71a and opening 72a.

Figure 14:
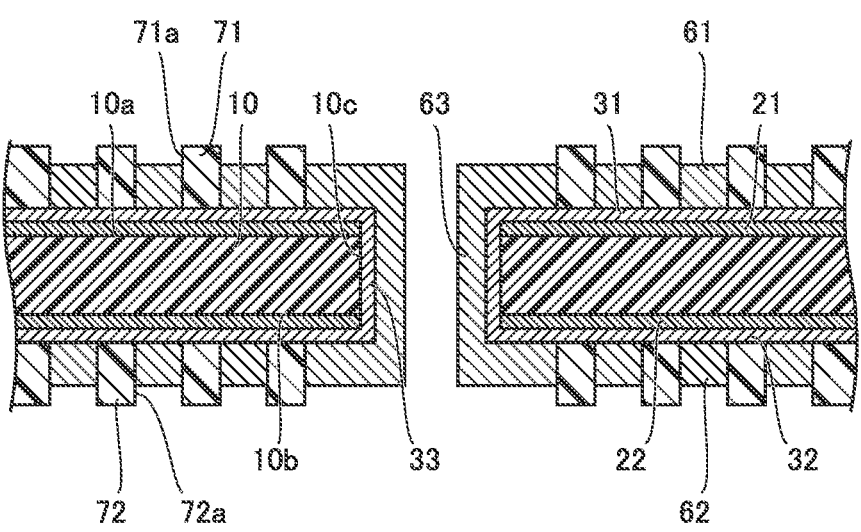
FIG. 14 is a cross-sectional view for illustrating an electrolytic plating step S8.

FIG. 14 is a cross-sectional view for illustrating electrolytic plating step S8. In electrolytic plating step S8, as shown in FIG. 14, first electrolytic copper plating layer 61 is formed on first electroless copper plating layer 31 exposed at opening 71a, and second electrolytic copper plating layer 62 is formed on second electroless copper plating layer 32 exposed at opening 72a. In electrolytic plating step S8, third electrolytic copper plating layer 63 is formed on third electroless copper plating layer 33. First electrolytic copper plating layer 61, second electrolytic copper plating layer 62, and third electrolytic copper plating layer 63 are formed by applying current to first electroless copper plating layer 31, second electroless copper plating layer 32, and third electroless copper plating layer 33, respectively, in a plating solution containing copper to perform electrolytic plating.

Figure 15:
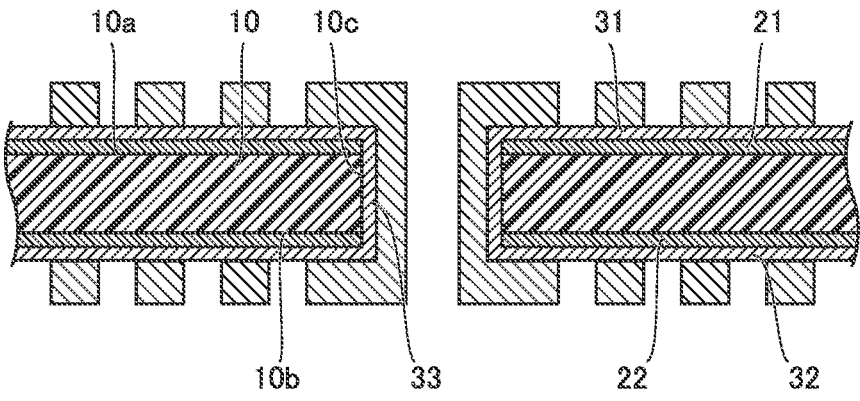
FIG. 15 is a cross-sectional view for illustrating a resist pattern removal step S9.

FIG. 15 is a cross-sectional view for illustrating resist pattern removal step S9. In resist pattern removal step S9, as shown in FIG. 15, resist pattern 71 on first electroless copper plating layer 31 is removed, and resist pattern 72 on second electroless copper plating layer 32 is removed. As a result, first electroless copper plating layer 31 and first conductive layer 21 are exposed between two adjacent first electrolytic copper plating layers 61, and second electroless copper plating layer 32 and second conductive layer 22 are exposed between two adjacent second electrolytic copper plating layers 62.

In etching step S10, the portions of first electroless copper plating layer 31 and first conductive layer 21 exposed between the two adjacent first electrolytic copper plating layers 61 and the portions of second electroless copper plating layer 32 and second conductive layer 22 exposed between the two adjacent second electrolytic copper plating layers 62 are removed by etching. Through the above steps, printed wiring board 200 having the structure shown in FIG. 11 is formed.

(Effects of Substrate 100 for Printed Wiring Board and Printed Wiring Board 200)

Hereinafter, the effects of substrate 100 for a printed wiring board and printed wiring board 200 will be described.

In substrate 100 for a printed wiring board, the amount of palladium in base film 10 at the inner wall surface of through hole 10c is increased. That is, in substrate 100 for a printed wiring board, third electroless copper plating layer 33 is formed using palladium catalyst 43. Therefore, in printed wiring board 200 formed by using substrate 100 for a printed wiring board, reliability in conduction between first wiring line 51 and second wiring line 52 is achieved.

In the process of manufacturing substrate 100 for a printed wiring board, when catalyst application step S4 is performed, masking film 41 is disposed on first conductive layer 21, and masking film 42 is disposed on second conductive layer 22. Thus, palladium catalyst 43 is not applied to the surface of first conductive layer 21 and the surface of second conductive layer 22.

In addition, in the process of manufacturing substrate 100 for a printed wiring board, first electroless copper plating layer 31 and second electroless copper plating layer 32 are rapidly formed on first conductive layer 21 and second conductive layer 22, respectively, by applying current between electrode 311 and electrode roller 331 and between electrode 311 and electrode roller 332 during an initial stage of electroless plating step S6. As a result, the penetration of the plating solution into first conductive layer 21 and second conductive layer 22 is suppressed.

Therefore, in substrate 100 for a printed wiring board, the amount of palladium in base film 10 at each of first main surface 10a and second main surface 10b is smaller than the amount of palladium in base film 10 at the inner wall surface of through hole 10c.

First electroless copper plating layer 31 and second electroless copper plating layer 32 are grown on first conductive layer 21 and second conductive layer 22, respectively. In addition, in first step S61, first electroless copper plating layer 31 and second electroless copper plating layer 32 are rapidly grown on the surface of first conductive layer 21 and the surface of second conductive layer 22, respectively. Therefore, nickel contained in the plating solution is unlikely to reach first conductive layer 21 and first main surface 10a under first conductive layer 21 as well as second conductive layer 22 and second main surface 10b under second conductive layer 22.

On the other hand, the inner wall surface of through hole 10c is in contact with the plating solution. In addition, third electroless copper plating layer 33 on the inner wall surface of through hole 10c is not an electroless copper plating layer which rapidly grows by being driven with electrical energy due to the current application, but an electroless copper plating layer which grows by being driven with palladium catalyst 43. Therefore, the amount of nickel in base film 10 at each of first main surface 10a and second main surface 10b is smaller than the amount of nickel in base film 10 at the inner wall surface of through hole 10c.

In a case where the amount of palladium or the amount of nickel in base film 10 at each of first main surface 10a and second main surface 10b is large, palladium or nickel in base film 10 exposed between the two adjacent first electrolytic copper plating layers 61 and between the two adjacent second electrolytic copper plating layers 62 needs to be removed in etching step S10.

In this case, since an undercut may occur in first wiring line 51 and second wiring line 52, when the amount of palladium in base film 10 is large at each of first main surface 10a and second main surface 10b, it is difficult to form first wiring line 51 and second wiring line 52 at a fine pitch.

However, since printed wiring board 200 is formed using substrate 100 for a printed wiring board in which the amount of palladium in base film 10 is small at each of first main surface 10a and second main surface 10b, the undercut of first wiring line 51 and second wiring line 52 is unlikely to occur when etching step S10 is performed, and thus first wiring line 51 and second wiring line 52 can be formed at a fine pitch. The undercut of first wiring line 51 refers to a notch formed between first electroless copper plating layer 31 and first electrolytic copper plating layer 61 on a side surface of first wiring line 51. Similarly, the undercut of second wiring line 52 refers to a notch formed between second electroless copper plating layer 32 and second electrolytic copper plating layer 62 on a side surface of second wiring line 52.

As described above, according to printed wiring board 200 formed by using substrate 100 for a printed wiring board, first wiring line 51 and second wiring line 52 can be formed at a fine pitch while ensuring the reliability in conduction between first wiring line 51 and second wiring line 52.

<Evaluation of Fine Pitch of Wiring Line>

Using sample 1 to sample 7, an influence of the amount of palladium at the main surface of base film 10 and at the inner wall surface of the through hole of base film 10 on a fine pitch of wiring line was evaluated. The amount of palladium in base film 10 on first main surface 10a was changed for sample 1 to sample 7. In addition, the amount of palladium in first conductive layer 21 and the amount of palladium in first electroless copper plating layer 31 were also changed for sample 1 to sample 7.

TABLE 1

| Sample | 1 | 2 | 3 | 4 | 5 | 6 | 7 |
|---|---|---|---|---|---|---|---|
| Pd Amount in Base Film 10 at First Surface 10a (atomic %) | 0.02 | 0.06 | 0.09 | 0.002 | 0.005 | 0.008 | 0.004 |
| Pd Amount in First Conductive Layer 21 (atomic %) | 0.1 | 0.6 | 0.8 | 0.01 | 0.05 | 0.08 | 0.04 |
| Pd Amount in First Electroless Copper Plating Layer 31 (atomic %) | 0.5 | 1.3 | 2.3 | 0.03 | 0.04 | 0.07 | 0.05 |
| Evaluation of Fine Pitch | B | C | D | A | A | B | A |

Figure 16:
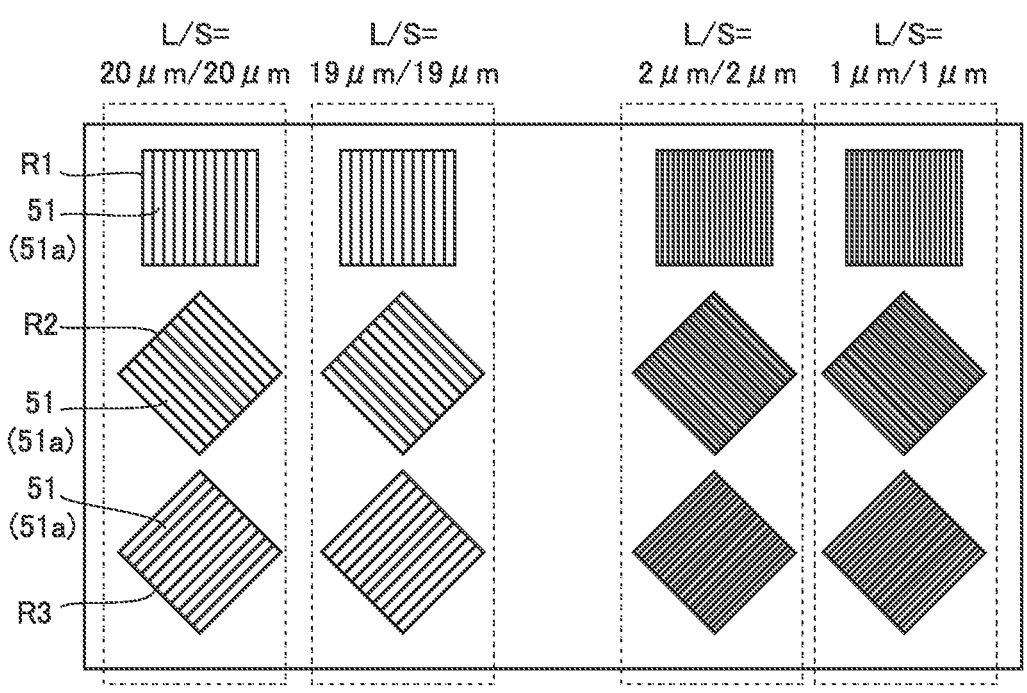
FIG. 16 is a plan view of a TEG for first evaluation.

For the evaluation of fine pitch of wiring line, a test element group (TEG) for first evaluation was used. FIG. 16 is a plan view of the TEG for first evaluation. As shown in FIG. 16, the TEG for first evaluation includes base film 10 and first wiring line 51. In the TEG for first evaluation, first main surface 10a has 20 wiring line formation regions R1, 20 wiring line formation regions R2, and 20 wiring line formation regions R3. In a left-and-right direction, 20 wiring line formation regions R1, 20 wiring line formation regions R2, and 20 wiring line formation regions R3 are arranged in rows.

First wiring line 51 having a plurality of wiring line portions 51a is formed on wiring line formation region R1, wiring line formation region R2, and wiring line formation region R3. Wiring line portions 51a formed on wiring line formation region R1 extend in an up-and-down direction. Wiring line portions 51a formed on wiring line formation region R2 and wiring line portions 51a formed on wiring line formation region R3 extend in directions inclined by 45° and −45° relative to the up-and-down direction, respectively.

Wiring line portions 51a formed on the n-th (n is a natural number of 20 or less) wiring line formation region R1 from the right among 20 wiring line formation region R1 have an L/S value of n μm/n μm. L is a width of wiring line portions 51a, and S is distance DIS1. L/S values for wiring line portions 51a formed on wiring line formation region R2 and wiring line portions 51a formed on wiring line formation region R3 were changed as well. An aspect ratio of wiring line portions 51a (a value obtained by dividing a height of wiring line portions 51a by a width of wiring line portions 51a) was set to be from 1 to 2.

First wiring line 51 was observed using a scanning electron microscope (SEM) for each of 20 wiring line formation regions R1, each of 20 wiring line formation regions R2, and each of 20 wiring line formation regions R3 to determine whether or not the wiring line formation was properly performed.

When minimum values of the width and distance DIS1 at which wiring line portions 51a were able to be properly formed were 10 μm or less, the evaluation was determined as A. When minimum values of the width and distance DIS1 at which wiring line portions 51a were able to be properly formed were more than 10 μm and 20 μm or less, the evaluation was determined as B. When minimum values of the width and distance DIS1 at which wiring line portions 51a were able to be properly formed were more than 20 μm and 30 μm or less, the evaluation was determined as C. When minimum values of the width and distance DIS1 at which wiring line portions 51a were able to be properly formed were more than 30 μm, the evaluation was determined as D.

As shown in Table 1, when the amount of palladium in base film 10 at first main surface 10a was 0.02 atomic percent or less, the evaluation of the fine pitch was B or higher. On the other hand, when the amount of palladium in base film 10 at first main surface 10a was more than 0.02 atomic percent, the evaluation of the fine pitch was C or lower.

<Evaluation of Reliability in Conduction of Wiring Line>

Using sample 8 to sample 14, an influence of the amount of palladium at the inner wall surface of the through hole of base film 10 on reliability in conduction of the wiring line was evaluated. As shown in Table 2, the amount of palladium in base film 10 at the inner wall surface of through hole 10c was changed for sample 8 to sample 14.

TABLE 2

| Sample | 8 | 9 | 10 | 11 | 12 | 13 | 14 |
|---|---|---|---|---|---|---|---|
| Pd Amount in Base Film 10 at Inner Wall Surface of Through Hole 10c (atomic %) | 0.03 | 0.06 | 0.11 | 0.04 | 0.07 | 0.12 | 0.003 |
| Evaluation of Reliability in Conduction | D | B | A | D | A | A | E |

Figure 17:
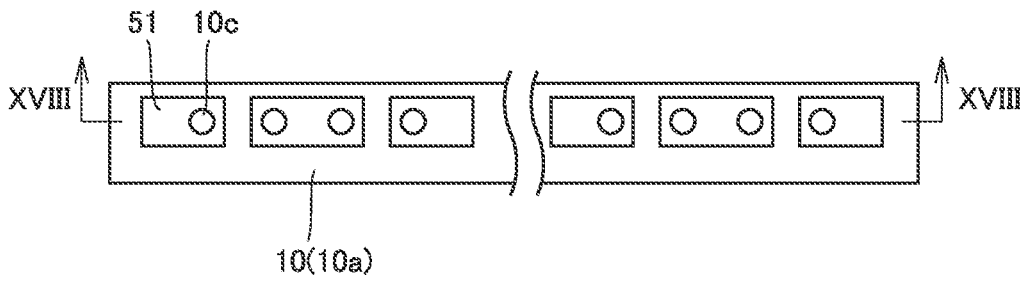
FIG. 17 is a plan view of a TEG for second evaluation.
Figure 18:
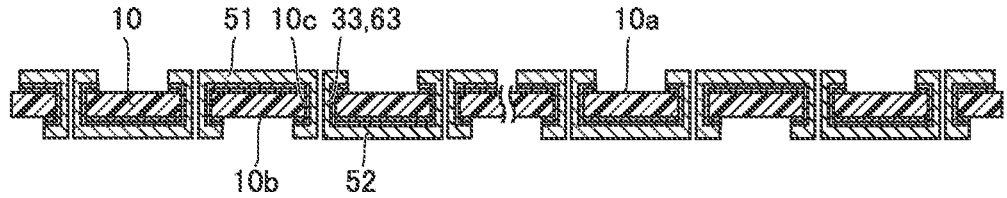
FIG. 18 is a cross-sectional view taken along line XVIII-XVIII in FIG. 17.

For the evaluation of the reliability in conduction of the wiring line, a TEG for second evaluation was used. FIG. 17 is a plan view of a TEG for second evaluation. FIG. 18 is a cross-sectional view taken along line XVIII-XVIII in FIG. 17. As shown in FIG. 16 and FIG. 17, the TEG for second evaluation includes base film 10, first wiring line 51, second wiring line 52, third electroless copper plating layer 33, and third electrolytic copper plating layer 63.

In the TEG for second evaluation, 10000 through holes 10c were arranged in a row, and 10000 daisy chains were formed by first wiring line 51, second wiring line 52, third electroless copper plating layer 33, and third electrolytic copper plating layer 63.

For each of the samples, 1000 TEGs for second evaluation were prepared. Resistivities of 10 million daisy chains were measured for each of the samples, and a ratio (conduction failure rate) of through holes 10c having a resistivity of $1 \times 10^{-5} \Omega \cdot m$ or more was calculated. When a conduction failure rate was less than 0.5 ppm, the evaluation was determined as A. When a conduction failure rate was more than 0.5 ppm and 1 ppm or less, the evaluation was determined as B. When a conduction failure rate was more than 1 ppm and 10 ppm or less, the evaluation was determined as C. When a conduction failure rate was more than 10 ppm and 100 ppm or less, the evaluation was determined as D. When a conduction failure rate was 100 ppm or more, the evaluation was determined as E.

As shown in Table 2, when the amount of palladium at the inner wall surface of through hole 10c was 0.06 atomic percent or more, the evaluation was B or higher. On the other hand, when the amount of palladium at the inner wall surface of through hole 10c was less than 0.06 atomic percent, the evaluation was D or lower.

<Overall Evaluation>

From the above, when the amount of palladium in base film 10 at each of first main surface 10a and second main surface 10b is 0.02 atomic percent or less and the amount of palladium in base film 10 at the inner wall surface of through hole 10c is 0.06 atomic percent or more, first wiring line 51 and second wiring line 52 can be formed at a fine pitch while ensuring the reliability in conduction between first wiring line 51 and second wiring line 52.

In a case where first electroless copper plating layer 31, second electroless copper plating layer 32, and third electroless copper plating layer 33 are formed by the electroless plating method using palladium catalyst 43, the amount of palladium in base film 10 at each of first main surface 10a and second main surface 10b is approximately the same as the amount of palladium in base film 10 at the inner wall surface of through hole 10c. Therefore, when first electroless copper plating layer 31, second electroless copper plating layer 32, and third electroless copper plating layer 33 are formed by such a method, first wiring line 51 and second wiring line 52 cannot be formed at a fine pitch while ensuring the reliability in conduction between first wiring line 51 and second wiring line 52.

However, in substrate 100 for a printed wiring board, third electroless copper plating layer 33 is formed by the electroless plating method using palladium catalyst 43, while first electroless copper plating layer 31 and second electroless copper plating layer 32 are formed by the electroless plating method using the current application without using palladium catalyst 43. Therefore, in substrate 100 for a printed wiring board, the amount of palladium in base film 10 at each of first main surface 10a and second main surface 10b can be made smaller than the amount of palladium in base film 10 at the inner wall surface of through hole 10c, and first wiring line 51 and second wiring line 52 can be formed at a fine pitch while ensuring the reliability in conduction between first wiring line 51 and second wiring line 52.

It should be understood that the embodiments disclosed herein are illustrative and non-restrictive in every respect. The scope of the present invention is defined by the terms of the claims rather than the embodiments described above, and is intended to include any modifications within the scope and meaning equivalent to the terms of the claims.

REFERENCE SIGNS LIST 100 substrate for a printed wiring board; 200 printed wiring board; 10 base film; 10a first main surface; 10b second main surface; 10c through hole; 21 first conductive layer; 21a through hole; 22 second conductive layer; 22a through hole; 31 first electroless copper plating layer; 32 second electroless copper plating layer; 33 third electroless copper plating layer; 41, 42 masking film; 41a through hole; 42a through hole; 43 palladium catalyst; 51 first wiring line; 51a wiring line portion; 52 second wiring line; 52a wiring line portion; 61 first electrolytic copper plating layer; 62 second electrolytic copper plating layer; 63 third electrolytic copper plating layer; 71 resist pattern; 71a opening; 72 resist pattern; 72a opening; 300 plating apparatus; 310 plating treatment tank; 311 electrode; 320 roller; 331, 332 electrode roller; 340 power supply; DIS1, DIS2 distance; DR1 first direction; DR2 second direction; DR3 third direction; L laser; R1 wiring line formation region; R2 wiring line formation region; R3 wiring line formation region; S1 preparation step; S2 conductive layer formation step; S3 through hole formation step; S4 catalyst application step; S5 film peeling step; S6 electroless plating step; S61 first step; S62 second step; S7 resist pattern formation step; S8 electrolytic plating step; S9 resist pattern removal step; S10 etching step.

The invention claimed is:

1. A substrate for a printed wiring board, the substrate comprising:

a base film having a first main surface and a second main surface;

a first conductive layer disposed on the first main surface;

a second conductive layer disposed on the second main surface;

a first electroless copper plating layer disposed on the first conductive layer;

a second electroless copper plating layer disposed on the second conductive layer; and a third electroless copper plating layer, wherein, in the base film, a through hole extending through the base film along a thickness direction of the base film is formed, the third electroless copper plating layer is disposed on an inner wall surface of the through hole, and an amount of palladium in the base film at each of the first main surface and the second main surface is smaller than an amount of palladium in the base film at the inner wall surface.

2. The substrate for a printed wiring board according to claim 1, wherein the amount of palladium in the base film at each of the first main surface and the second main surface is 0.02 atomic percent or less, and the amount of palladium in the base film at the inner wall surface is 0.06 atomic percent or more.

3. The substrate for a printed wiring board according to claim 1, wherein the amount of palladium in the base film at each of the first main surface and the second main surface is 0.008 atomic percent or less, and the amount of palladium in the base film at the inner wall surface is 0.07 atomic percent or more.

4. The substrate for a printed wiring board according to claim 1, wherein the first conductive layer and the second conductive layer are layers each including a plurality of sintered copper particles.

5. The substrate for a printed wiring board according to claim 4, wherein an amount of palladium in each of the first conductive layer and the second conductive layer is 0.08 atomic percent or less.

6. The substrate for a printed wiring board according to claim 1, wherein an amount of palladium in each of the first electroless copper plating layer and the second electroless copper plating layer is 0.07 atomic percent or less.

7. The substrate for a printed wiring board according to claim 1, wherein an amount of nickel in the base film at each of the first main surface and the second main surface is smaller than an amount of nickel in the base film at the inner wall surface.

8. A printed wiring board comprising:

a base film having a first main surface and a second main surface;

a first wiring line having a first conductive layer disposed on the first main surface, a first electroless copper plating layer disposed on the first conductive layer, and a first electrolytic copper plating layer disposed on the first electroless copper plating layer;

a second wiring line having a second conductive layer disposed on the second main surface, a second electroless copper plating layer disposed on the second conductive layer, and a second electrolytic copper plating layer disposed on the second electroless copper plating layer;

a third electroless copper plating layer; and a third electrolytic copper plating layer, wherein, in the base film, a through hole extending through the base film along a thickness direction of the base film is formed, the third electroless copper plating layer is disposed on an inner wall surface of the through hole, the third electrolytic copper plating layer is disposed on the third electroless copper plating layer, the first wiring line is electrically connected to the second wiring line by the third electroless copper plating layer and the third electrolytic copper plating layer, and an amount of palladium in the base film at each of the first main surface and the second main surface is smaller than an amount of palladium in the base film at the inner wall surface.

9. The printed wiring board according to claim 8, wherein a distance between two portions of the first wiring line adjacent to each other with a space between the two portions of the first wiring line and a distance between two portions of the second wiring line adjacent to each other with a space between the two portions of the second wiring line are each 20 μm or less.

\* \* \* \* \*